United States Patent
Eisner et al.

(10) Patent No.: US 7,725,851 B2
(45) Date of Patent: May 25, 2010

(54) DEVICE, SYSTEM AND METHOD FOR FORMAL VERIFICATION

(75) Inventors: Cynthia Rae Eisner, Zichron Yaacov (IL); Sharon Keidar-Barner, Yokneam Ilit (IL); Sitvanit Ruah, Rehovot (IL); Ohad Shacham, Kfar Monash (IL); Tatyana Veksler, Zichron Yaakov (IL)

(73) Assignee: International Business Machines Corporation, Armonk, NY (US)

( * ) Notice: Subject to any disclaimer, the term of this patent is extended or adjusted under 35 U.S.C. 154(b) by 323 days.

(21) Appl. No.: 11/845,118

(22) Filed: Aug. 27, 2007

(65) Prior Publication Data

US 2009/0064064 A1 Mar. 5, 2009

(51) Int. Cl.
*G06F 17/50* (2006.01)
(52) U.S. Cl. .............................. 716/5; 716/1
(58) Field of Classification Search ............. 716/1, 716/5
See application file for complete search history.

(56) References Cited

U.S. PATENT DOCUMENTS

| | | | |
|---|---|---|---|
| 2003/0225552 A1* | 12/2003 | Ganai et al. | 703/2 |
| 2005/0010907 A1* | 1/2005 | Namjoshi | 717/124 |
| 2006/0075305 A1* | 4/2006 | Robinson et al. | 714/38 |
| 2007/0011671 A1* | 1/2007 | Kahlon et al. | 717/170 |
| 2008/0082946 A1* | 4/2008 | Zilic et al. | 716/5 |

FOREIGN PATENT DOCUMENTS

WO WO2006/060316 6/2006

OTHER PUBLICATIONS

I. Beer et al., "On-the-fly model checking of RCTL formulas", in Proc. 10$^{th}$ Internaional Conference on Computer Aided Verification (CAV98), LNCS 1427, pp. 184-194, 1998.
S. Ben-David et al. "Automata construction for regular expressions in model checking" Embedding , Jun. 2004, IBM research report H-0229.
S. Ben-David et al., "Automata construction for on-the-fly model checking psl safety simple subset", Jun. 2005, IBM research report H-0234.
S. Ben-David et al., "The safety simple subset", in Haifa Verification Conference, pp. 14-29, 2005.
A. Biere et al., Liveness checking as safety checking, Electronic Notes in Tehoretical Computer Science, 66 No. 2, 2002.
R. Bloem et al., "Efficient decision procedures for model checking of linear time logic properties," in 11$^{th}$ Internation Conference on Computer Aided Verification (CAV'99), LNCS 1633, pp. 222-235, 1999.

(Continued)

*Primary Examiner*—Jack Chiang
*Assistant Examiner*—Suchin Parihar (57) ABSTRACT

Device, system and method of efficient automata-based implementation of liveness properties for formal verification. A system according to embodiments of the invention includes a property transformation module to receive an assume verification directive on a liveness property in a property specification language, and to translate the property a fairness statement that uses a deterministic automaton. The deterministic automaton is exponential in the size of the input property. The assume verification directive may be transformed into a strong suffix implication in the property specification language.

15 Claims, 2 Drawing Sheets

OTHER PUBLICATIONS

M. Boule et al., "Efficient automata-based assertion-checker synthesis of psl properties", in Workshop in High Level Design, Validation, and Test (HLDVT06), 2006.

D. Bustan et al., "Automata construction for psl", May 2005, Weizmann Institute of Science, Technical Report MCS05-04.

IEEE. IEEE Standard for property specification language (PSL), Sep. 2005.

Y. Kesten et al., "Algorithmic Verification of linear temporal logic specifications," in Kl Larsen eta al . . . , Nov. 16, 1998.

O. Kupferman et al., "An automata-theoretic approach to modular model checking", ACM Trans. Program Lang. Syst. 22(1): 87-128, 2000.

M. Maidl, "The common fragment of CTL and LTL", IEEE Symposium on Flundations of Computer Science, pp. 643-652, 2000.

M.Y. Vardi, An automata-theoretic approach to linear temporal logic, in F. Moller and G. Birtwistle, eds. Logics for Concurrency: Sturcture versusl Automata, Vo. 1043 of Lecture Notes in Computer Science, p. 238-266, 1996.

M.Y. Vardi et al, "An automata-theoretic approach to automatic program verification", in F. Moller and G. Birtwistle, eds, Proceedings of the First Symposium on Logic in Computer Science, pp. 322-331, 1985.

* cited by examiner

DEVICE, SYSTEM AND METHOD FOR FORMAL VERIFICATION

FIELD

Some embodiments of the invention relate to the field of formal verification, including but not limited to formal verification of hardware and software designs.

BACKGROUND

Assertion-based verification (ABV) is a methodology utilized in hardware design verification, and is reflected in the standardization of some assertion languages. For example, PSL (Property Specification Language) was adopted as an Institute of Electrical and Electronics Engineers (IEEE) standard (IEEE standard 1850, "Standard for PSL: Property Specification Language"), and is used in electronic design automation (EDA) for formal verification as well as for simulation of complex hardware designs.

In formal verification, or model checking, an exhaustive analysis of the design state-space is performed in order to determine, across substantially all possible scenarios, whether the design obeys its specification.

For example, assertions written in PSL may be embedded in the register transfer level (RTL) description of a hardware design, and may then be formally verified through model checking. The behavioral specifications define intended design behavior, which is expected to be demonstrated during verification and further define error situations, which are expected to not occur during verification. Behavioral specifications may thus provide improved visibility into the internal state of a design.

Properties in a specification language may be classified into safety properties, which possess a finite counterexample; and liveness properties, which do not possess a finite counterexample. For example, a safety property states that a "bad" event never happens, for example, that "two processes are never at the critical section together"; whereas a liveness property states that a "good" event eventually happens, for example, that "Process A eventually enters the critical section."

Verifying safety properties may be insufficient to assure that a design meets its requirements, since a safety property may pass even if nothing actually occurs in the design under test. A bounded safety property may be used to check that an event actually occurs, but may fail if the event occurs outside of the defined bound. Unfortunately, increasing the bound may result in an undesirably large automaton or in an inefficient model checking process. Additionally, the counterexample for a bounded property may be long and difficult to inspect.

In contrast, in cases where the exact cycle on which the event occurs is not important, a liveness property may provide a useful answer, and may result in a smaller automaton as well as an efficient model checking process (e.g., more efficient than the model checking process of a bounded property).

SUMMARY

Some embodiments include devices, systems, and methods of efficient automata-based implementation of liveness properties for formal verification.

In some embodiments, a system for formal verification of liveness properties under assumptions includes a property transformation module to translate a liveness property associated with an assume verification directive in a property specification language into a fairness statement that uses a deterministic automaton. The deterministic automaton may accept a strong suffix implication in the property specification language, and may represent the assume verification directive.

In some embodiments, the property specification language may be the simple subset of PSL or may correspond to the simple subset of PSL, for example, a subset of SVA corresponding to the simple subset of PSL, a subset of LTL corresponding to the simple subset of PSL, or a subset of CTL corresponding to a common fragment of LTL and CTL and corresponding to the simple subset of PSL.

In some embodiments, a state space of the fairness statement may include a single fairness constraint independent of the number of assertions associated with the assume verification directive. Embodiments of the invention may provide other and/or additional benefits and/or advantages.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Further, reference numerals may be repeated among the figures to indicate corresponding or analogous elements. Moreover, some of the blocks depicted in the drawings may be combined into a single function. The figures are listed below.

DETAILED DESCRIPTION

In the following detailed description, numerous specific details are set forth in order to provide a thorough understanding of some embodiments of the invention. However, it will be understood by persons of ordinary skill in the art that embodiments of the invention may be practiced without these specific details. In other instances, well-known methods, procedures, components, units and/or circuits have not been described in detail so as not to obscure the discussion. It is intended that the embodiments and figures disclosed herein be considered illustrative rather than restrictive.

Portions of the discussion herein utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices. In addition, the term "plurality" may be used herein to describe two or more items; for example, a plurality of items includes two or more items.

Embodiments of the invention may include apparatuses for performing the operations herein. An apparatus may be specially constructed for the desired purposes, or it may comprise a general-purpose computer selectively activated or reconfigured by a computer program stored in the computer. Such a computer program may be stored in a computer readable storage medium, such as, but not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions and capable of being coupled to a computer system bus.

The processes and displays presented herein are not inherently related to any particular computer or other apparatus. Various general-purpose systems may be used with programs in accordance with embodiments herein, or it may be convenient to construct a more specialized apparatus to perform desired methods. In addition, embodiments of the invention are not described with reference to any particular programming, scripting, modeling, and/or hardware description language. A variety of programming and other such languages may be used to implement embodiments of the invention.

PSL may be used to describe properties or assertions that are required to hold true (namely, to evaluate to true) on the design under verification. PSL is defined in layers. For example, the Boolean layer is the foundation; it supports the temporal layer, which uses Boolean expressions to specify behavior over time. The verification layer includes directives that specify how tools should use temporal layer specifications to verify functionality of a design. Finally, the modeling layer defines the environment within which verification is to occur.

Temporal logic is a branch of logic used to reason about properties whose truth-value depends on time. The operators of the logic allow to refer to time without introducing time explicitly. For example, the temporal layer of PSL is a temporal logic that is based on linear temporal logic (LTL), which may be used to reason about paths of a model. Other temporal logics may differ in various aspects such as their syntax, semantics and underlying model of time.

Temporal logics such as LTL and PSL contain both weak and strong operators:

A strong operator is an operator that has a terminating condition that is required to eventually occur. For example, the PSL property "busy until! done" uses the strong operator "until!" to require that done will eventually hold and that busy will hold until done holds. Strong operators in PSL may typically be denoted with an exclamation mark "!".

A weak operator is an operator that either has no terminating condition or its terminating condition is not required to occur. For example, the PSL operator "always" is a weak operator since it has no terminating condition, and the PSL operator "until" is a weak operator since its terminating condition is not required to happen. For example, the PSL property "busy until done" requires that busy holds until done holds but it does not require done to hold. That is, a path on which busy holds on every cycle but done never holds satisfies this property.

Fairness constraints may be used to restrict the behavior of a design. For example, a fairness condition may specify a set of states in the machine, and require that in any acceptable behavior these states must be traversed infinitely often. As used herein, the term "fairness" may refer to a fairness condition or constraint.

PSL verification directives may instruct a formal verification tool what to do with a property. For example, the assert directive instructs to verify that the property holds; and the assume directive instructs to assume that the property holds when checking other properties.

The term "PSL simple subset" as used herein includes a subset of PSL consisting of behavioral specifications in which time advances monotonically. The properties in PSL simple subset may be the most commonly used, as they can be simulated and have efficient model checking algorithms.

The term "SERE" as used herein includes a sequential extended regular expression (SERE) describing single- or multi-cycle behavior built from a series of Boolean expressions. For example, the SERE {req; !ack[*]; ack} describes a behavior in which req is high at a first cycle, ack is low for zero or more subsequent cycles, and then ack is high for one cycle. The syntax and semantics for SEREs can be found in Appendix B of the IEEE specification for PSL.

The term "suffix implication" as used herein includes, for example, a suffix implication formula of the form $\{r\} \mapsto \phi$ where r is a regular expression (or SERE) and $\phi$ is a PSL formula. This formula states that whenever a prefix of a given path matches the regular expression r, the suffix of that path should satisfy the requirement $\phi$.

The term "lhs" as used herein refers to the left-hand side, for example, of a suffix implication statement. The term "rhs" as used herein refers to the right-hand side, for example, of a suffix implication statement.

The term "NFA" as defined herein includes a non-deterministic finite automata (NFA) which is a tuple $N = \langle B, Q, Q_0, \delta, A \rangle$ where B is the input alphabet; Q is a finite non-empty set of states; $Q_0 \subseteq Q$ is a set of initial states; $\delta: Q \times B \mapsto Q$ is the state transition function; and A is the set of final states, a (possibly empty) subset of S. Unless stated otherwise, the input alphabet B for the automata described herein is the set of Boolean expressions over P, where P is a set of atomic propositions.

The term "DTS" as defined herein includes a discrete transition system (DTS) which is a symbolic representation of a finite automaton on finite or infinite words, and is used herein to represent a finite state program. The definition herein may be similar to the definition of a fair discrete system (FDS).

A DTS is a tuple D: $\langle V, \Theta, \rho, A, \mathfrak{J} \rangle$ including multiple components as described herein:

A first component of the DTS is $V = \{u_1, \ldots, u_n\}$, which is a finite set of typed state-variables over possibly infinite domains. A state s is a type-consistent interpretation of V, assigning to each variable $u \in V$ a value s[u] in its domain. $\Sigma_V$ denotes the set of all states, and $B_V$ denotes the set of all Boolean expressions over the state-variables in V (when V is understood from the context, $\Sigma$ and B, may be used, respectively).

A second component of the DTS is $\Theta$, which is the initial condition, namely, an assertion characterizing all the initial states of the DTS.

A third component of the DTS is $\rho$, which is the transition relation. This is an assertion $\rho(V,V')$ relating a state $s \in \Sigma_V$ to its D-successor $s' \in \Sigma_V$ by referring to both unprimed and primed versions of the state-variables. The transition relation $\rho(V,V')$ identifies state s' as a D-successor of state s if $\langle s,s' \rangle \models \rho(V,V')$, where $\langle s,s' \rangle$ is the joint interpretation which interprets $u \in V$ as s[u] and u' as s'[u]

A fourth component of the DTS is A, which is the accepting condition for finite words. This is an assertion characterizing substantially all the accepting states for runs of the DTS satisfying finite words.

Finally, a fifth component of the DTS is $\mathfrak{J} = \{J_1, \ldots, J_K\}$, which is the justice (Büchi) accepting condition for infinite words. This is a set of assertions characterizing the sets of accepting states for runs of the DTS satisfying infinite words. The justice requirement $J \in \mathfrak{J}$ stipulates that substantially every infinite computation contains infinitely many states satisfying J.

The term "Büchi automaton" as used herein refers to the extension of a finite automaton to infinite inputs. For example, a Büchi automaton may accept an infinite input sequence, iff (namely, if and only if) there exists a run of the automaton which has infinitely many states in the set of final states. The term "iff" is used herein as an abbreviation for "if and only if".

In some embodiments, D is a DTS for which the above components have been identified. A run of D is a finite or infinite non-empty sequence of states $\sigma: s_0 s_1 s_2 \ldots$ satisfying the requirements of initiality (namely, that $s_0\models\Theta$) and of consecution (namely, that for each $j=0,1,\ldots$, the state $s_{j+1}$ is a D-successor of state $s_j$). A run satisfying the requirement of maximality (namely, that it is either infinite, or terminates at a state $s_k$ which has no D-successors) is referred to as a maximal run.

In some embodiments, $U\tilde{\Im}V$ is a subset of the state-variables. A run $\sigma: s_0 s_1 s_2 \ldots s_n \ldots$ is said to be satisfying a finite word $w = b_0 b_1 \ldots b_n$ over $B_U$ iff for every i, $0 \leq i \leq n$, $s_i\models b_i$. A run $\sigma: s_0 s_1 s_2 \ldots s_{n+1} \ldots$ satisfying a finite word $w = b_0 b_1 \ldots b_n$ is said to be accepting w iff $s_{n+1}$ satisfies A. An infinite run $\sigma: s_0 s_1 s_2 \ldots$ is said to be satisfying an infinite word $w = b_0 b_1 \ldots$ over $B_U$ iff for every $i \geq 0$, $s_i\models b_i$. An infinite run $\sigma$ satisfying an infinite word w is said to be accepting w iff for each $J \in \Im$, the run $\sigma$ contains infinitely many states satisfying J.

For a state s, $s|_U$ denotes the restriction of s to the state-variables in U. For example, the state $s|_U$ agrees with s on the interpretation of the state-variables in U, and does not provide an interpretation for variables in V\U. For a run $\sigma: s_0 s_1 s_2 \ldots$, the term $\sigma|_U$ indicates the run $s_0|_U s_1|_U s_2|_U \ldots$.

Discrete transition systems may be composed in parallel. For example, $D_i = \langle V_i, \Theta_i, \rho_i, A_i, \Im_i \rangle i \in \{1,2\}$, are two discrete transition systems. The synchronous parallel composition of $D_1$ and $D_2$ is denoted $D_1 |||D_2$ and is defined to be $D_1|||D_2 = \langle V_1 \cup V_2, \Theta_1, \hat{}, \Theta_2, \rho_1 \hat{} \rho_2, A_1 \hat{} A_2, \Im_1 \hat{} \Im_2 \rangle$. The execution of D may be regarded as the joint execution of $D_1$ and $D_2$.

Compositional verification, wherein the verified module is composed of two parts, is a verification methodology that may be applied to model checking under assumptions. PSL verification directives include the "assert" directive, which instructs the verification tool to verify that the given property holds, and the "assume" directive, which instructs the verification tool to assume that the given property holds when checking other properties. The composition of assume$\phi$ and assert$\psi$ in PSL creates an assume-guarantee pair for use in compositional verification.

As an overview, some embodiments of the invention provide an efficient automata-based technique for implementing the PSL assume directive on liveness properties (including strong operators) for model checking. The PSL assume directive is supported in model checking by translating "assume f" to a fairness constraint using a deterministic automaton. For example, an automaton for suffix-implication is modified such that it may be used to reduce the suffix-implication to a fairness statement.

For example, in some embodiments, the implementation of assume may use { }|->{ } as the main automaton, and may mark the last state of the deterministic rhs automata, denoted $q_{last}$, and the states corresponding to the rhs SERE. In some embodiments, a bit-wise determinization is used to generate a deterministic automaton. For example, the accepting states of the bit-wise automaton are states in which either the bit of $q_{last}$ is on or no bit corresponding to the rhs SERE is on.

The deterministic automaton and fairness statement are then transferred to the model-checking engine. For example, the engine is given the fairness statement: fairness (going into an accepting state). Such a statement may cause the model-checking engine to leave only paths satisfying that from each deterministic state it is possible to get to a deterministic state that does not contain any bad state. Optionally, a SAT-based model-checking engine may be used to process the fairness statement. In addition, some embodiments of the invention may allow using a CTL model checker.

In some embodiments, to support LTL-based constructs, rewriting rules similar to those known in the art are used in order to convert from LTL-based liveness operators of PSL to strong suffix implication. For example, the suffix implication {lhs}|->{rhs}! states that for every match of lhs there exists a match of rhs starting at the same cycle lhs ends, where lhs and rhs are extended regular expressions (PSL SEREs).

In some embodiments, for further optimization, a special automaton may be constructed for basic cases such as, for example, F p or G p$\rightarrow$F q, in order to avoid the overhead of the translation to a SERE.

Some embodiments include model checking of assume liveness. Unlike for safety properties, it is not sufficient to create a state machine and an invariant for each assume. For liveness properties, a behavior is required to be forced on infinite paths, for example by using a deterministic automata and a fairness statement. Thus, some embodiments provide reduction of assume liveness to fairness. The fairness is then implemented in the model checker for example, by utilizing a method to encode properties of a type AF p (where p is a Boolean expression) to safety and/or liveness properties.

For example, a counter-example to a liveness property in a finite system is a prefix followed by a loop, which may be found by non-deterministically saving a previously visited state and later checking whether the current state already occurred. In some embodiments, this translation may be extended to handle fairness by checking whether after the beginning of a loop (i.e., after saving a state) all the fairness conditions have occurred. Such a method according to embodiments of the invention may avoid duplicating the states for the assume in every assert, and may, for example, use a state only once.

Some embodiments utilize another approach for model checking a directive assume$\phi$ (where $\phi$ is a safety property), for example, by constructing a deterministic automaton that accepts traces satisfying $\phi$ and then eliminates all paths that fall into a bad state of the automaton. Some embodiments include the implementation of assume liveness to existing formal verification tools, such as IBM's RuleBase PE, and use a more efficient translation of assume that results a smaller automaton for properties in PSL simple subset or at least a subset thereof.

One method of model checking under assumptions reduces the assume-guarantee pair to verifying the PSL assertion that $\phi$ implies $\psi$ globally: assert $G(\phi \rightarrow \psi)$. However, this method may not be efficient when there are multiple assertions to verify under the same temporal assumption, for example, due to the need for a fairness constraint for each assert $G(\phi \rightarrow \psi)$, and therefore for each assertion. Thus, for n assertions and m assumptions such a method would require n*m fairness constraints. In accordance with some embodiments of the invention, a model checking method for assumptions may require only m fairness constraints, resulting in a state space that may be smaller by $2^{(n-1)m}$ compared to a traditional method.

One method of model checking LTL properties for implementing the PSL assert directive is to construct the composition of the model with the automata of the negation of the property, and to check that the language accepted by the resulting model is empty. The resulting automaton may be of size $EXP(|\phi|)$ in the worst case. The same approach may be extended for model checking PSL properties, and results in an automaton of size 2EXP(|φ|) in the worst case when the SERE "&&" operator appears in φ, and of up to EXP(|φ|) in size when the && operator does not appear in φ. In some embodiments, these results may be used for implementing the assume directive with a resulting complexity of EXP(n), where n is the size of the automata described above.

For a property φ in the common fragment of LTL and CTL there exists a weak Büchi automaton accepting ¬φ of linear size. The language of a weak Büchi automaton A is empty in a model M iff M|=AGAF A where A is the accepting condition of A. Thus, for every LTL property φ in PSL simple subset the validity of φ in M can be checked by checking AGAF ¬A where A is the accepting condition of the linear Büchi automaton for ¬φ. However, this weak Büchi automaton cannot be used to check assume, but only assert.

Some embodiments thus provide an efficient method to support PSL assume verification directive with liveness properties in model checking.

Figure 1:
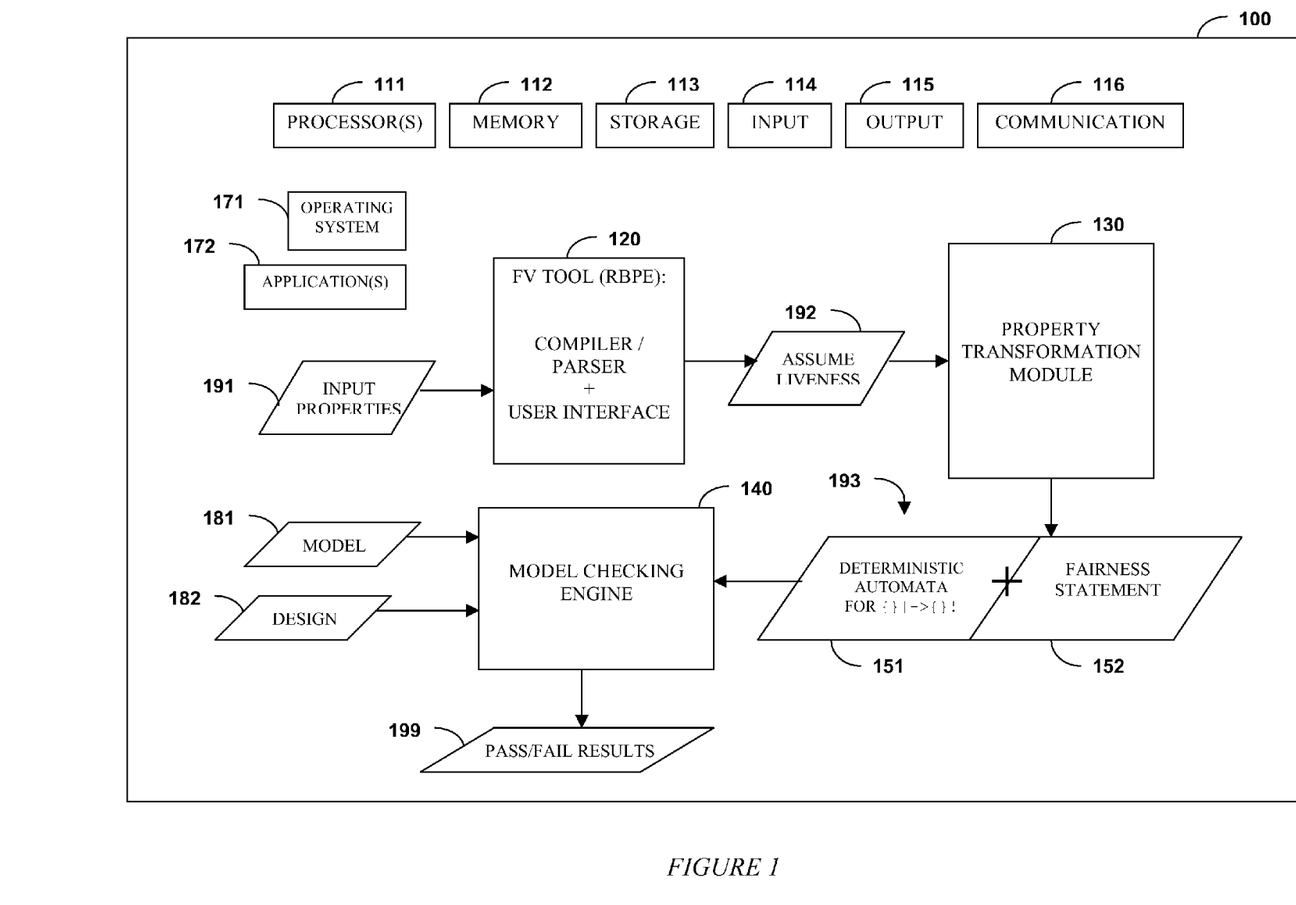
FIG. 1 is a schematic block diagram of a formal verification system in accordance with a demonstrative embodiment of the invention.

FIG. 1 schematically illustrates a system 100 for formal verification in accordance with some demonstrative embodiments of the invention. System 100 may be implemented or may operate using a computing system or a computing device such as, for example, a computer, a personal computer (PC), a server computer, a computing platform, a client/server system, a mobile computer, a portable computer, a laptop computer, a notebook computer, a tablet computer, a network of multiple inter-connected devices, or the like. System 100 may include, for example, one or more processors 111, a memory unit 112, a storage unit 113, an input unit 114, an output unit 115, and a communication unit 116. System 100 may include other suitable hardware components and/or software components Processor 111 may include, for example, a central processing unit (CPU), a digital signal processor (DSP), a microprocessor, a host processor, a controller, a plurality of processors or controllers, a chip, a microchip, one or more circuits, circuitry, a logic unit, an integrated circuit (IC), an application-specific integrated circuit (ASIC), or any other suitable multi-purpose or specific processor or controller. Processor 111 may execute instructions and process data, for example, of an operating system (OS) 171 or of one or more software applications 172.

Memory unit 112 may include, for example, a random access memory (RAM), a read only memory (ROM), a dynamic RAM (DRAM), a synchronous DRAM (SD-RAM), a flash memory, a volatile memory, a non-volatile memory, a cache memory, a buffer, a short term memory unit, a long term memory unit, or other suitable memory units or storage units. Memory unit 112 may be coupled to processor 111 by a system bus or other suitable interconnect. Storage unit 113 may include, for example, a hard disk drive, a floppy disk drive, a compact disk (CD) drive, a CD-ROM drive, a digital versatile disk (DVD) drive, or other suitable removable or non-removable storage units. Memory unit 112 and/or storage unit 113 may, for example, store data processed by system 100.

Input unit 114 may include, for example, a keyboard, a keypad, a mouse, a touch-pad, a stylus, a microphone, or other suitable pointing device or input device. Output unit 115 may include, for example, a cathode ray tube (CRT) monitor or display unit, a liquid crystal display (LCD) monitor or display unit, a screen, a monitor, a speaker, or other suitable display unit or output device. Communication unit 116 may include, for example, a wired or wireless network interface card (NIC), a wired or wireless modem, a wired or wireless receiver and/or transmitter, a wired or wireless transmitter-receiver and/or transceiver, a radio frequency (RF) communication unit or transceiver, or other units able to transmit and/or receive signals, blocks, frames, transmission streams, packets, messages and/or data. Communication unit 116 may optionally include or may optionally be associated with one or more antennas.

In some embodiments, the components of system 100 may be enclosed in a common housing, packaging, or the like, and may be interconnected or operably associated using one or more wired or wireless links. In other embodiments, for example, components of system 100 may be distributed among multiple or separate devices, may be implemented using a client/server configuration or system, may communicate using remote access methods, or the like.

System 100 may be adapted to perform formal verification of a hardware design ("design-under-test") and, accordingly, may include one or more hardware components and/or one or more software components able to perform one or more operations of the formal verification and/or model checking process. For example, in some embodiments, system 100 may include a formal verification tool 120 (e.g., a software application such as IBM's RuleBase PE), a property transformation module 130, and a model-checking engine 140.

Formal verification tool 120 may receive input properties 191, e.g., PSL properties, and may compile and/or parse the input properties, e.g., into a form appropriate for user interface. For example, a user may select one or more desired properties for verification in the design-under-test. A user may select an assume liveness property 192 for sending to the property transformation module 130.

In some embodiments, property transformation module 130 may receive an assume verification directive on a liveness property in a property specification language, and may translate the property 192 to a fairness statement 152 that uses a deterministic automaton 151, as explained herein. The deterministic automaton is exponential in size of the input property. The assume verification directive may be transformed into assume of a strong suffix implication 151 in the property specification language.

Model checking engine 140 may receive an output 193 from the property transformation module 130, including the fairness statement 152. In some embodiments, model-checking engine 140 may be a SAT-based engine adapted to handle an input fairness statement. Based on input automaton 151, together with model 181 and design 182, the model-checking engine may produce pass/fail results 199.

Although portions of the discussion herein relate, for demonstrative purposes, to formal verification of hardware and/or software, embodiments of the invention may be used for other formal verifications, for example, verification of a set of laws, of a business process, or the like.

Although portions of the discussion herein relate, for demonstrative purposes, to specifications in PSL, embodiments of the invention may be used with other types of specifications and/or specification languages, for example, SVA, CTL, or others, and/or combinations thereof.

Figure 2:
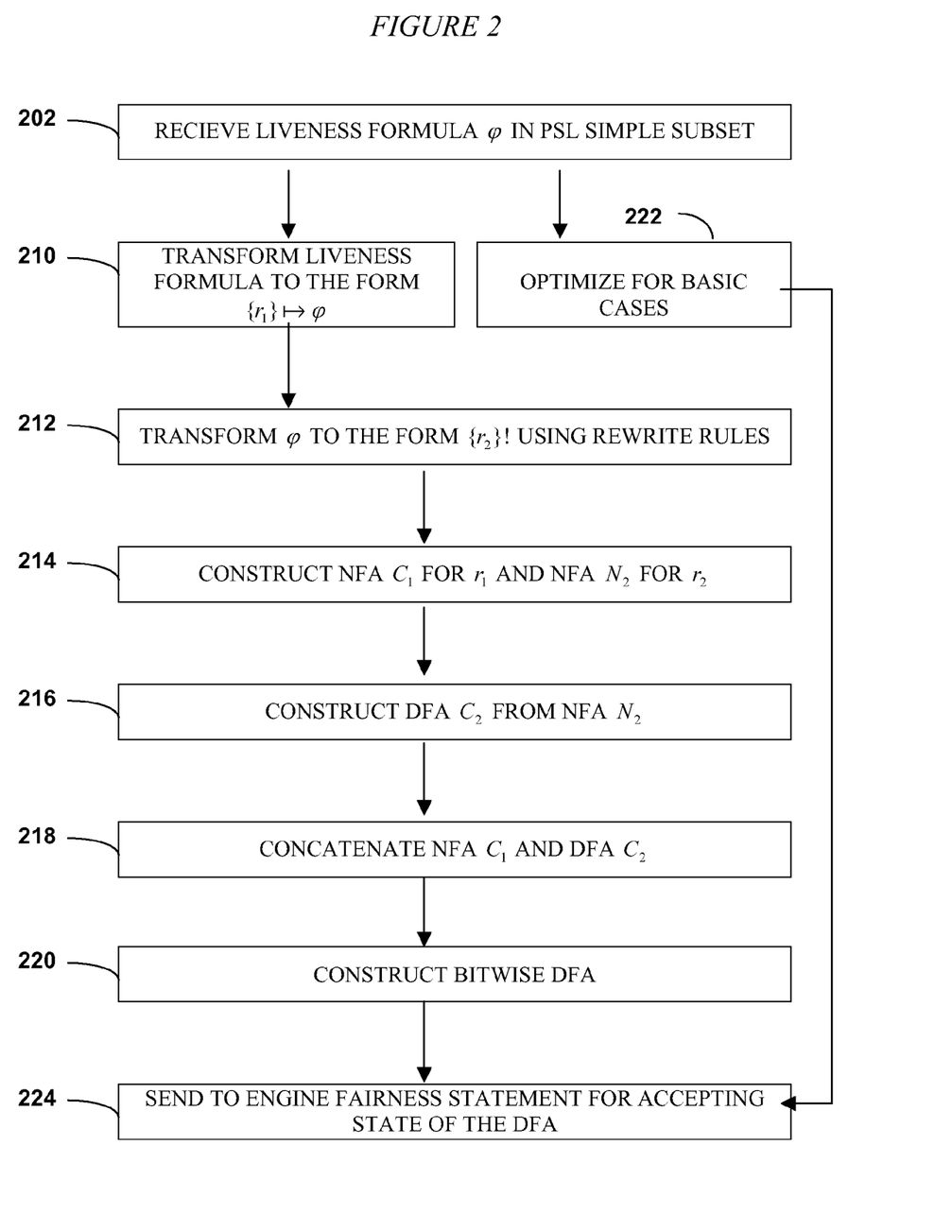
FIG. 2 is schematic flow-chart of a method of automata construction and implementation in accordance with a demonstrative embodiment of the invention.

FIG. 2 schematically illustrates a method of automata construction and implementation in accordance with a demonstrative embodiment of the invention. For example, the method of FIG. 2 may be performed by a property transformation module such as module 130 of FIG. 1.

In some embodiments, to implement "assume liveness", the method constructs a deterministic automaton for suffix implication $\{r_1\} \mapsto \{r_2\}$ using the concatenation of the automata $N_1$ of $r_1$ and the automata $N_2$ of $r_2$. The same construction may be used both for weak and for strong suffix implication. In some embodiments, the same construction may be applied to the suffix implication construct of SVA and to the common fragment of LTL and ACTL.

As indicated at block 202, the method includes receiving a liveness formula $\phi$ in the simple subset of PSL. In some embodiments, the formula $\phi$ may contain strong operators.

As indicated at block 222, the method may optionally include optimization in some basic cases. For example, where the liveness formula $\phi$ is of the form F p or G p→F q, optimization may include using a deterministic automaton of the form G p→F q in order to avoid the overhead of the translation to a SERE. The deterministic automaton may be sent directly to the model-checking engine in these cases, as indicated by the outside arrow to block 244.

As another example of optimization, in some embodiments, an invariant constraint may be used instead of fairness, for example, in cases where fairness constraints may typically be ignored by the model-checker. Such cases include, for example, on-the-fly verification of assert $\phi$, where $\phi$ is a safety property. Thus, in some embodiments, if given the case assume {r1}|->{r2}!, optimization may include the implementation of assume of the weak suffix implication form assume {r1}!|->{r2}, for which an invariant constraint may be used instead of fairness.

In cases not covered by the optimizations, the method includes transforming the liveness formula $\phi$ to the form $\{r_1\} \mapsto \phi$, as indicated at block 210.

As indicated at block 212, the method includes transforming $\phi$ to the form $\{r_2\}!$, for example, using rewrite rules as known by one of skill in the art.

As indicated at block 214, the method includes constructing an NFA $C_1$ for $r_1$ and an NFA $N_2$ for $r_2$.

As indicated at block 216, the method includes constructing a DFA $C_2$ from the NFA $N_2$.

In some embodiments, the construction of $C_2$ may ensure that a bad state of $N_2$ does not appear in states of the DFA that contain other states of the NFA $N_2$. Formally: where the bad state of $N_2$ is denoted by $q_{sink}$, and the set of states of the constructed DFA are denoted by Q, then for every $S \in Q$ such that there exists $q \neq q_{sink} \in S$, the method removes $q_{sink}$ from S. Additionally, to construct the DFA $C_2$, the method may merge all the states that contain an accepting state of $N_2$, for example, as follows: Denote the accepting states of $N_2$ by A. Add a new state $q_{last}$. For every subset S of states, if in the DFA there exists an edge (S, p, $S_2$) such that there exists $q \in A \cap S_2$, then replace the edge by (S, p, $q_{last}$).

As indicated at block 218, the method includes concatenating $C_2$ to $C_1$, for example, as follows:

Let $O_1 = \langle B(V_1), Q^1, Q_0^1, \delta^1, F^1 \rangle$ be the NFA for $r_1$ and $O_2 = \langle B(V^2), Q^2, Q_0^2, \delta^2, F^2 \rangle$ the DFA accepting $r_2$. The DTS for $(\{r_1\} \mapsto \{r_2\}!) = \langle B, Q^O, Q_0^O, \delta^O, F^O \rangle$ is constructed by concatenation of $O_1$ and $O_2$. Formally:

$B = B(V^1 \cup V^2)$.
$Q^O = Q^1 \cup Q^2 \cup q_{bad}$, where $q_{bad}$ is a new state.
$Q_0^O = Q_0^1$.
$\delta^O = \delta^1 \cup \delta^2 \cup$
$\bigcup_{q_2 \in F1} \bigcup_{q_3 \in Q_0^2} \bigcup_{(q_1,l_1,q_2) \in \delta^1} \bigcup_{(q_3,l_2,q_4) \in \delta^2} (q_1, l_1 \wedge l_2, q_4) \cup$
$\bigcup_{q_2 \in F^1} \bigcup_{(q_1,l_1,q_2) \in \delta^1} (q_1, l_1 \wedge (\bigwedge_{q_3 \in Q_0^2} \bigwedge_{(q_3,l_2,q_4) \in \delta^2} \neg l_2), q_{bad})$.
$F^O = F^2$.

As indicated at block 220, the method includes constructing a bitwise DFA. That is, for each NFA state i, the bitwise DFA includes a bit $b_i$ such that $b_i$ is on iff the NFA is at state i. For example, an accepting state of the bitwise DFA may be a state with no pending obligations. That is, either the bit of $q_{last}$ is on, or no bit corresponding to the right hand side $r_2$ is on.

As indicated at block 224, the method includes sending a fairness statement to the model checking engine for the accepting state of the bitwise DFA: fairness(at accepting state of the bitwise DFA).

In some embodiments, the formal verification system may be applied to the assert verification directive on liveness properties. For example, for assert $\{r_1\} \mapsto \{r_2\}!$, the following construction may be used to construct a non-deterministic automaton for suffix implication $\{r_1\} \mapsto \{r_2\}$ using two separate automata that run in parallel.

Given a formula of the form $\{r_1\} \mapsto \{r_2\}$ where $r_1$ and $r_2$ are SEREs, let $N_1$ and $N_2$ be NFAs for $r_1$ and $r_2$ respectively. In some embodiments, construct $\hat{N}_2$ as follows: Define an auxiliary signal $r_1$_matched that is assigned non-deterministically to "0" or "1" on a cycle in which $N_1$ found a match of $r_1$, and is "0" in other cycles. Define another auxiliary signal prev_$r_1$_matched that is "1" a cycle after the first time match holds and remains "1".

In order to start checking for a match of $r_2$ only when $r_1$ is matched, conjunct the labels of the edges from the states in $Q_0^2$ with $r_1$_matched $\wedge \neg$prev_$r_1$_matched. In order to check that there exists a match of $r_2$ for each match of $r_1$, add an initial stuttering state before the other initial states. In addition, a stuttering final state may be added to make sure that once $\{r_1\} \mapsto \{r_2\}$ passed, it will remain in an accepting state. Run the two automata in parallel: At each cycle $N_1$ finds a match of $r_1$, $N_2$ starts advancing according to $r_2$. Additionally, in accordance with embodiments of the invention, construct an automaton whose role is to check the liveness condition.

The model checking engine is asked to check a specification of the form AGAF p that describes that once checking begins on $r_2$, a final state of $N_2$ will eventually be reached. That is, that $r_2$ will eventually be matched.

Formally, parallel automata construction may be described as follows:

Construct an NFA accepting $r_1$. Denote it by $N_1 = \langle B, Q^1, Q_0^1, \delta^1, F^1 \rangle$.

Define $r_1$_matched as follows:
assign r1_matched:=case $$\bigcup_{q_2 \in F^1, (q_1, \sigma, q_2) \in \delta^1} (sat_1 = q_1 \cap \sigma) : \{0, 1\};$$

else: 0;
esac;

Define an auxiliary signal prev_$r_1$_matched that is true if $r_2$ is currently being checked for a previous match of $r_1$. prev_$r_1$_matched is defined as follows:
assign init(prev_r1_matched):=0
assign next(prev_r1_matched):=case
r1_matched & !prev_r1_matched: 1;
else: prev_r1_matched;
esac;

Construct an NFA $N_2 = \langle B, Q^2, Q_0^2, \delta^2, F^2 \rangle$ for $r_2$.

Let $\hat{N}_2$ be the NFA obtained by adding to $N_2$ an initial stuttering state and a final stuttering state and constraints on the initial edges. That is, $\hat{N}_2 = \langle B, \hat{Q}^2, \hat{Q}_0^2, \hat{\delta}^2, \hat{A}^2 \rangle$ where
$\hat{Q}^2 = Q^2 \cup \{q_{in}, q_{last}\}$, where $q_{in}, q_{last}$ are new states
$\hat{Q}_0^2 = Q_0^2 \cup \{q_{in}\}$
$\hat{\delta}^2 = (\delta^2 \setminus \bigcup_{\{(q, \sigma, q_2) \in \delta^2 | q \in Q_0^2\}} (q, \sigma, q_2)))$
$\cup \{(q_{in}, \text{true}, q_{in}), (q_{last}, \text{true}, q_{last})\}$
$\cup \bigcup_{\{(q, \sigma, q_2) \in \delta^2 | q \in Q_0^2\}} (q, \sigma \wedge r1\_matched, q_2)$
$\cup \bigcup_{q \in Q_0^2} (q_{in}, \text{true}, q) \cup \bigcup_{(q_1, \sigma, q_2) \in \delta^2, q_2 \in F^2} (q_1, \sigma, q_{last})$
$\hat{F} = \{q_{last}\}$ Let $DET_2$ be the DFA resulting by having for each state i of $\hat{N}_2$ a bit $det_i$ that is active iff $\hat{N}_2$ is at state i.

Create a DTS D: $\langle V, \Theta, \rho, A, \mathfrak{I}\rangle$ for $\{r_1\} \mapsto \{r_2\}$ as follows:
$V = \{sat_1, prev\_r_1\_matched\} \cup_{i \in Q^2} det_i$ where $sat_1$ is a variable representing the current state of $N_1$, $prev\_r_1\_matched$ is a Boolean signal that is true iff $r_2$ is currently being checked for some match of $r_1$ (as defined above).

$\Theta = (\vee_{\in Q_0}!sat_1 = i) \wedge det_{q_{in}} \wedge (\wedge_{i \in Q^2 \setminus \{q_{in}\}} \neg det_i)$
$\wedge \neg prev\_r_1\_matched$ $A = \vee_{\{(q_1, \sigma, q_2) \in \delta^2 | q_2 \in F^2\}} det_{q_1} \wedge \sigma$
$\vee_{(q_1, \sigma, q_2) \in \delta^1} sat_1 = q_1 \wedge \sigma \wedge sat'_1 = q_2$
$\sigma = \wedge(\wedge_{i \in Q^2}(\vee_{(q_1, \sigma, q_2) \in \delta_2}((det_{q_1} \wedge \sigma \wedge det'_{q_2}) \vee \neg det'_{q_2}))$
$\wedge (\neg prev\_r_1\_matched \wedge prev\_r_1\_matched' \vee prev\_r_1\_matched \wedge prev\_r_1\_matched')$ For checking $\{r_1\} \mapsto \{r_2\}$ the model checking engine is asked to check $prev\_r_1\_matched \rightarrow AF\vee_{\in F_2} det_i$.

Embodiments of the invention may take the form of an entirely hardware embodiment, an entirely software embodiment, or an embodiment including both hardware and software elements. Some embodiments may be implemented in software, which includes but is not limited to firmware, resident software, microcode, or the like.

Furthermore, some embodiments of the invention may take the form of a computer program product accessible from a computer-usable or computer-readable medium providing program code for use by or in connection with a computer or any instruction execution system. For example, a computer-usable or computer-readable medium may be or may include any apparatus that can contain, store, communicate, propagate, or transport the program for use by or in connection with the instruction execution system, apparatus, or device.

In some embodiments, the medium may be an electronic, magnetic, optical, electromagnetic, infrared, or semiconductor system (or apparatus or device) or a propagation medium. Some demonstrative examples of a computer-readable medium include a semiconductor or solid-state memory, magnetic tape, a removable computer diskette, a random access memory (RAM), a read-only memory (ROM), a rigid magnetic disk, and an optical disk. Some demonstrative examples of optical disks include compact disk-read only memory (CD-ROM), compact disk-read/write (CD-R/W), and DVD.

In some embodiments, a data processing system suitable for storing and/or executing program code may include at least one processor coupled directly or indirectly to memory elements, for example, through a system bus. The memory elements may include, for example, local memory employed during actual execution of the program code, bulk storage, and cache memories which may provide temporary storage of at least some program code in order to reduce the number of times code must be retrieved from bulk storage during execution.

In some embodiments, input/output or I/O devices (including but not limited to keyboards, displays, pointing devices, etc.) may be coupled to the system either directly or through intervening I/O controllers. In some embodiments, network adapters may be coupled to the system to enable the data processing system to become coupled to other data processing systems or remote printers or storage devices, for example, through intervening private or public networks. In some embodiments, modems, cable modems and Ethernet cards are demonstrative examples of types of network adapters. Other suitable components may be used.

Functions, operations, components and/or features described herein with reference to one or more embodiments, may be combined with, or may be utilized in combination with, one or more other functions, operations, components and/or features described herein with reference to one or more other embodiments, or vice versa.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. A method for verification of a design, comprising:
receiving a specification that the design is expected to satisfy subject to a group of one or more properties that are assumed to apply in the verification, the group comprising a liveness property, stating that a certain event will eventually occur in a state space of the design;
adding to the design a deterministic automaton having a set of states and representing an occurrence of the event over the states;
replacing the liveness property in the group of the properties that are assumed to apply in the verification with a fairness constraint, requiring that the states in the set must be traversed infinitely often as the design traverses the state space; and
applying a computerized model checker to verify the design, including the added deterministic automaton, subject to the fairness constraint.

2. The method according to claim 1, wherein adding the deterministic automaton comprises constructing the deterministic automaton corresponding to a suffix implication in which a prefix comprising a first sequence of the states is followed by a suffix comprising a second sequence of the states.

3. The method according to claim 2, wherein the suffix implication is a strong implication, such that when the prefix occurs, the suffix is then required to eventually occur.

4. The method according to claim 2, wherein constructing the deterministic automaton comprises constructing nondeterministic automata representing the first and second sequences of the states, and converting the nondeterministic automata into the deterministic automaton.

5. The method according to claim 1, wherein the one or more properties are received in a property specification language.

6. A system for verification of a design, comprising:
a memory, which is configured to store program code; and
one or more processors, which are configured to receive a specification that the design is expected to satisfy subject to a group of one or more properties that are assumed to apply in the verification, the set comprising a liveness property, stating that a certain event will eventually occur in a state space of the design, to add to the design a deterministic automaton having a set of states and representing an occurrence of the event over the states, to replace the liveness property in the group of the properties that are assumed to apply in the verification with a fairness constraint, requiring that the states in the set must be traversed infinitely often as the design traverses the state space, and to apply a model checking engine to verify the design, including the added deterministic automaton, subject to the fairness constraint.

7. The system according to claim 6, wherein the deterministic automaton corresponds to a suffix implication in which a prefix comprising a first sequence of the states is followed by a suffix comprising a second sequence of the states.

8. The system according to claim 7, wherein the suffix implication is a strong implication, such that when the prefix occurs, the suffix is then required to eventually occur.

9. The system according to claim 7, wherein the deterministic automaton is produced by constructing nondeterministic automata representing the first and second sequences of the states, and converting the nondeterministic automata into the deterministic automaton.

10. The system according to claim 6, wherein the one or more properties are received in a property specification language.

11. A computer program product comprising a computer-readable storage medium including a computer-readable program, wherein the computer-readable program when executed on a computer causes the computer to receive a specification that the design is expected to satisfy subject to a group of one or more properties that are assumed to apply in the verification, the set comprising a liveness property, stating that a certain event will eventually occur in a state space of the design, to add to the design a deterministic automaton having a set of states and representing an occurrence of the event over the states, to replace the liveness property in the group of the properties that are assumed to apply in the verification with a fairness constraint, requiring that the states in the set must be traversed infinitely often as the design traverses the state space, and to apply a model checking engine, which when executed, causes the computer to verify the design, including the added deterministic automaton, subject to the fairness constraint.

12. The product according to claim 11, wherein the deterministic automaton corresponds to a suffix implication in which a prefix comprising a first sequence of the states is followed by a suffix comprising a second sequence of the states.

13. The product according to claim 12, wherein the suffix implication is a strong implication, such that when the prefix occurs, the suffix is then required to eventually occur.

14. The product according to claim 12, wherein the deterministic automaton is produced by constructing nondeterministic automata representing the first and second sequences of the states, and converting the nondeterministic automata into the deterministic automaton.

15. The system according to claim 11, wherein the one or more properties are received in a property specification language.

* * * * *